(12) United States Patent
Brcka

(10) Patent No.: US 6,666,982 B2
(45) Date of Patent: Dec. 23, 2003

(54) PROTECTION OF DIELECTRIC WINDOW IN INDUCTIVELY COUPLED PLASMA GENERATION

(75) Inventor: Jozef Brcka, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/038,304

(22) Filed: Oct. 22, 2001

(65) Prior Publication Data
US 2003/0079838 A1 May 1, 2003

(51) Int. Cl.[7] .......................... C23C 16/00; C23C 25/68
(52) U.S. Cl. .......................... 216/68; 216/67; 438/710; 438/731; 118/723 I
(58) Field of Search .............................. 216/67, 68, 69, 216/62; 427/569, 575, 508; 438/710, 726, 727, 728, 729, 731, 788; 118/723 I, 723 IR, 723 AN, 723 MW, 723 ME, 723 MA, 723 MR; 156/345.41, 345.48, 345.49, 345.36; 315/111.51; 204/298.06, 298.34

(56) References Cited

U.S. PATENT DOCUMENTS 6,006,694 A * 12/1999 DeOrnellas et al. ...... 118/723 I 6,287,435 B1    9/2001 Drewery et al.

FOREIGN PATENT DOCUMENTS

JP    2001-85193    * 3/2003

* cited by examiner

Primary Examiner—Luz Alejandro-Mulero
(74) Attorney, Agent, or Firm—Wood, Herron & Evans, L.L.P.

(57) ABSTRACT

To protect a dielectric window in an inductively coupled plasma reactor from depositions of coating or etched material from the plasma, a dielectric insert is placed inside of the chamber closely adjacent the window. Where a slotted shield inside of the window protects the window from deposition, but has slots through which some material can pass in a direction toward the window, the insert is placed between the window and the shield. The insert is formed of a material that is compatible with the process being carried out on a semiconductor wafer within the chamber. Where the window and shield are planar, an unprocessed wafer of the same type and material as the wafer being processed is used for the insert.

7 Claims, 6 Drawing Sheets

PROTECTION OF DIELECTRIC WINDOW IN INDUCTIVELY COUPLED PLASMA GENERATION

This invention relates to the semiconductor wafer plasma processing, particularly to plasma deposition and etching processes, in which dielectric chamber walls or windows bound the chamber. In particular, the invention relates to inductively coupled plasma (ICP) generators in which RF energy is coupled into a vacuum chamber through a dielectric wall or window to energize a plasma inside of the chamber.

BACKGROUND OF THE INVENTION

Inductively coupled plasma (ICP) sources are finding increased use in the semiconductor processing industry. Ionized physical vapor deposition (iPVD) is performed, for example, in machines such as that disclosed in U.S. Pat. No. 6,080,287, U.S. patent application Ser. No. 09/442,600, and PCT Application No. PCT/US00/31756, all hereby expressly incorporated herein by reference. In such machines, metal ions are formed in a vacuum processing space by ionizing material sputtered from a target through a very dense, low electron temperature ICP formed in the processing space by coupling RF energy from an external coil through a dielectric window in the wall of the chamber, such as, for example, a planar window at the end of the chamber. A slotted deposition shield inside the chamber protects the window from the deposition of metal from the processing space. The metal, if allowed to deposit onto the window, would form an electrically conductive layer in which currents would be induced that would shield the processing space from the coil and prevent the coupling of the RF energy into the plasma. Slots in the shield prevent the formation of current paths in the film that would shield the coil, by conduction in the shield itself, if it is made of metal or other conductive material, or by conduction in the material that deposits onto the shield, whether the shield itself is conductive or not. The existence of the slots in the shield, however, eventually results in some accumulation of material on the window. This accumulation can, if too great, require a cleaning of the window more often than replacement of the sputtering target in the chamber, resulting in additional interruptions in the productive use of the machine. This is undesirable in that it reduces productivity and increases the cost of maintaining the machine and of the products produced. Even when the window does not require cleaning more often than target replacement is required, deposition onto the window can increase the thermal load on the window which can reduce the life of the window. Failure of the window results in process interruption and part damage, requiring its replacement. This is especially the case in larger machines, such as 300 millimeter wafer processing tools where the window is subjected to a substantial atmospheric pressure load.

Furthermore, in ICP etch machines and processes, for example as described in the commonly assigned and copending U.S. patent application Ser. No. 09/875,339, filed Jun. 6, 2001, hereby expressly incorporated by reference herein, the etching of conductive material from a substrate can lead to deposits onto dielectric windows that ultimately produce contamination problems similar to those that exist in physical vapor deposition (PVD) applications. Even non-conductive deposits onto such windows can require cleaning of the windows and thereby increase the cost of maintaining such etch machines or can lead to local temperature gradients and local stresses that can cause the windows to break.

Accordingly, the need exists for the prevention of contamination of dielectric windows in ICP deposition machines and processes and also in ICP etching machines and processes.

SUMMARY OF THE INVENTION

A primary objective of the present invention is to reduce chamber cleaning time and frequency in plasma processing, particularly in chambers having dielectric walls through which energy is coupled into the plasma. A further objective of the invention is also to protect dielectric walls and windows from accumulating coatings on their interior surfaces, particularly electrically conductive coatings, which, if permitted, can increase the mean time between the failures of such walls or windows, and to reduce the overall cost of operation of a plasma processing apparatus where such walls and windows are employed.

A more particular objective of the invention is to economically protect and reduce the need to clean dielectric walls or windows in ICP reactors in which energy is coupled from outside of the reactor chamber into the vacuum processing space within the reactor to sustain a plasma.

According to the principles of the present invention, an ICP deposition or etching apparatus having a dielectric wall or window is provided with a replaceable protective insert located inside of the wall or window to intercept material sputtered or etched in the chamber that would otherwise deposit on the inside surface of the dielectric wall or window. The insert may be provided between the window and any slotted or other type of primary shield that is provided on the inside of the chamber as the primary protection against coating of the wall or window, where the insert intercepts any material that passes through the slots toward the wall or window or otherwise bypasses the primary shield.

In accordance with the preferred embodiments of the invention, a dielectric window that separates a vacuum processing space within a plasma processing chamber from a coil or other antenna that is located outside the chamber is provided with a dielectric insert that covers the interior surface of the window. Where a deposition barrier is provided inside of the window in the form of a shield that is slotted to prevent electrical currents from being induced in the shield by RF energy from the antenna, the insert is positioned between the shield and the window. The invention is particularly practical for planar ICP sources where the inserts may be in the form of a disc or sheet. An unprocessed semiconductor wafer, or bare semiconductor wafer that has not been subjected to coating or etching processes, may be used for the insert to insure process compatibility with the process.

These and other objectives and advantages of the present invention will be more readily apparent from the following detailed description.

BRIEF DESCRIPTION OF THE DRAWINGS

FIGS. 2A–2D are graphs illustrating the average electromagnetic energy density along a line normal to and through the center of the window showing that the levels are essentially the same for various insert materials in the reactor of FIG. 1, and in which:

FIG. 2A shows the energy levels with 0, 1, 2 and 3 standard thickness (0.3 mm) aluminum oxide wafers;

FIG. 2B shows the energy levels with 0, 1, 2 and 3 standard thickness silicon wafers;

FIG. 2C shows the energy levels with 0, 1, 2 and 3 standard thickness aluminum nitride wafers; and FIG. 2D shows the energy levels comparing no insert and inserts made of three standard thickness aluminum oxide, aluminum nitride and silicon wafers.

DETAILED DESCRIPTION

Figure 1:
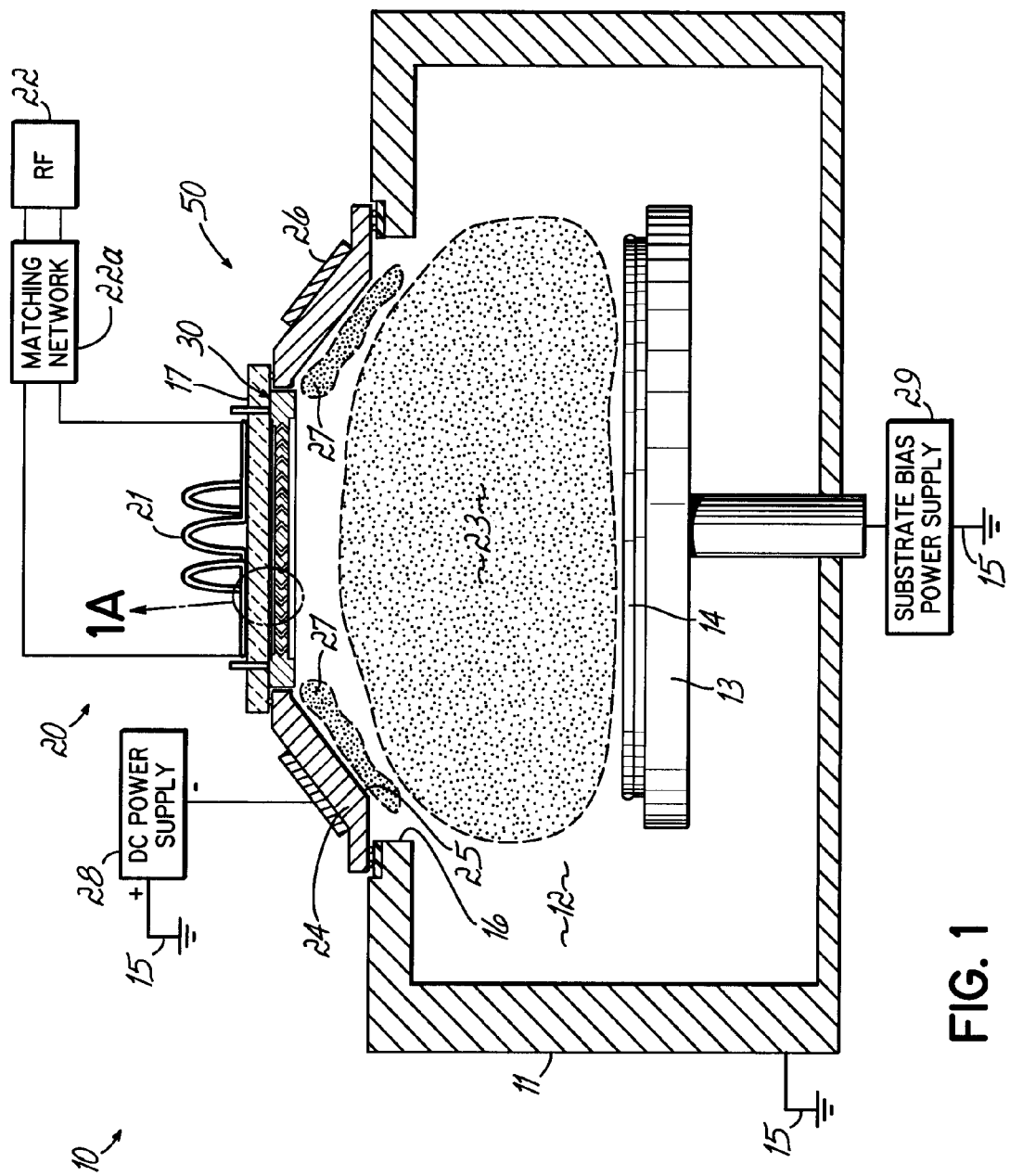
FIG. 1 is a diagrammatic view of an iPVD reactor adaptable according to principles of the present invention.

FIG. 1 illustrates an ionized physical vapor deposition reactor 10 of the type described in U.S. Pat. No. 6,080,287 and U.S. patent application Ser. No. 442,600, filed Nov. 18, 1999, both expressly incorporated by reference herein. The reactor 10 has a chamber wall 11 that encloses a vacuum chamber 12. A substrate support 13 is disposed within the chamber for holding an upwardly facing semiconductor wafer or other substrate 14 for processing. The chamber wall 11 is formed of, or lined with, metal and is electrically connected to a system ground 15. In the top of the chamber wall 11 is an opening 16 that is sealed by an iPVD source 50. The iPVD source 50 includes a target 24 of coating material and an RF energy source 20 for supplying energy to a plasma within the chamber 12. The target 24 is frusto-conical annular and is sealed around its outside edge to, and electrically insulated from, the wall 11 of the chamber 12. A generally circular dielectric window 17, preferably fabricated of ceramic, is sealed around its edge to the inner edge of the target 24, which completes the enclosure of the chamber 12 to support the maintenance of a vacuum within the chamber 12.

Behind the window 17 and outside of the chamber 12 is situated the RF source 20, which includes a coil or other antenna 21 connected through a matching network 22a across an RF power generator 22, which typically produces RF energy in the range of from 1 to 13.56 MHz. The antenna 21 is so positioned and configured to couple RF energy through the window 17 into the chamber 12 to form a high density plasma 23 in a low pressure processing gas within the chamber 12. The annular frusto-conical target 24 is located either entirely within the chamber 12 or in the upper portion of the wall 11, as shown, with a sputtering surface 25 thereof in communication with the inside of the vacuum chamber 12. A permanent magnet pack 26 is positioned behind the target 24 to form a closed magnetic field to trap a high energy sputtering plasma 27 over the surface 25 of the target 24 when energized with DC power from a power supply 28.

Figure 5:
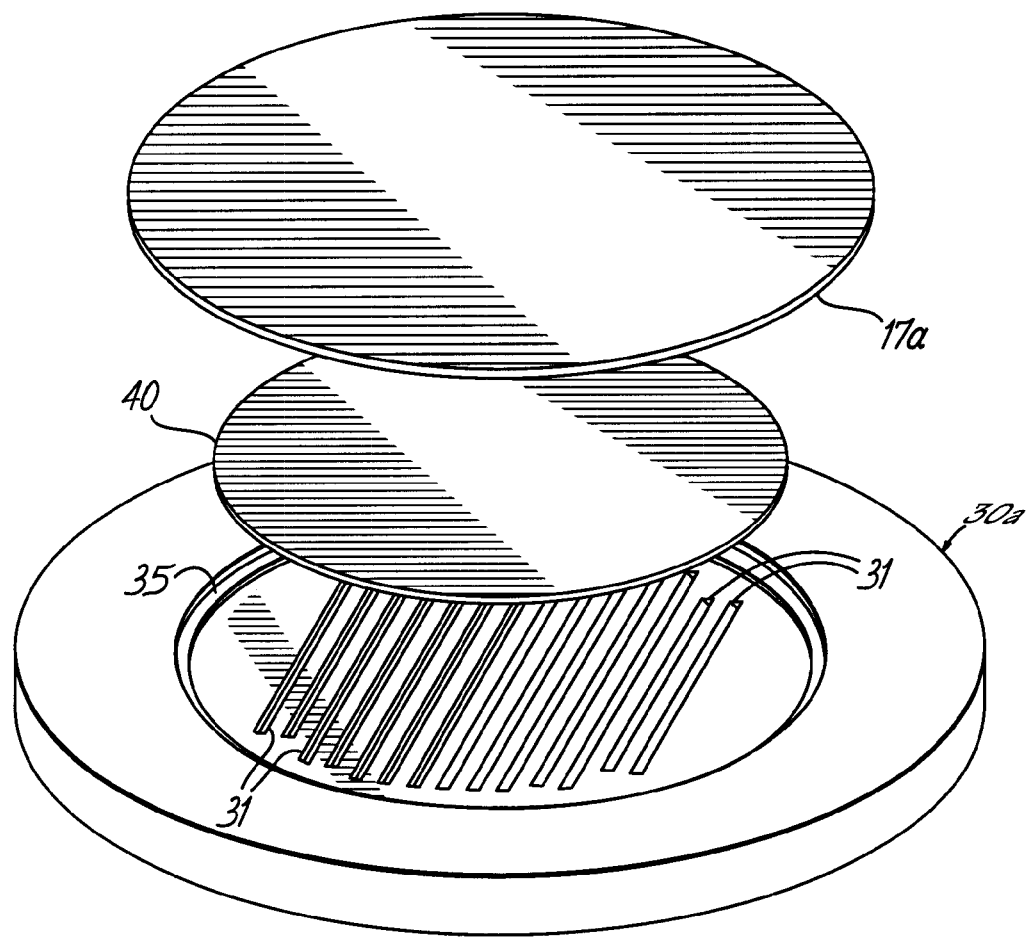
FIG. 5 is a disassembled perspective view of an alternative window assembly to that of FIGS. 3 and 4 for use in an ICP etch reactor.
Figure 6:
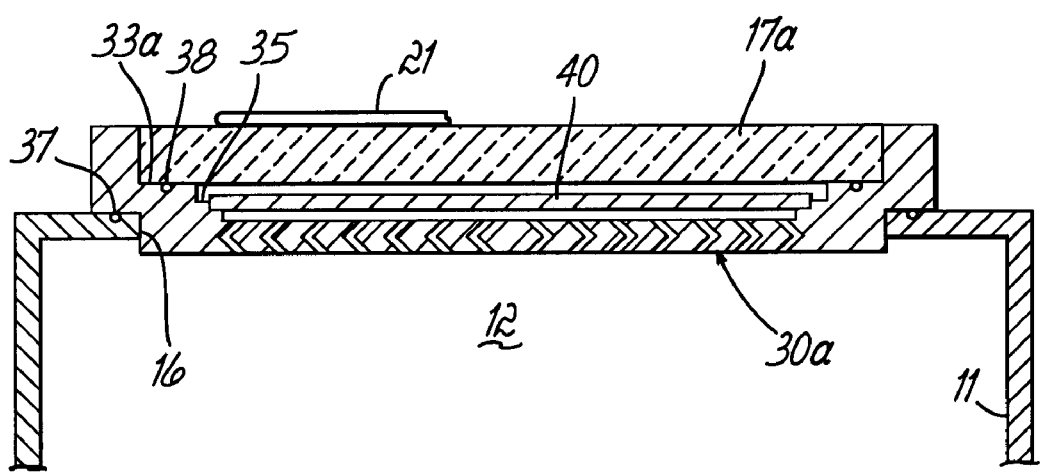
FIG. 6 is a cross section through the window assembly of FIG. 5.

Ions from the high density plasma 27 sputter material from the surface 25 of the target 24 into the processing chamber 12, where they are energized by the high density plasma 23. A bias power source 29 is usually provided, which is typically an RF source, which creates a negative DC bias on the wafer 14 that is mounted on the substrate support 13, so that positive ions from the plasma 23 are attracted toward the substrate 14. Without the target 24, and the opening 16 in the wall of the chamber being fully covered by a window, the apparatus 10 described above would essentially be an etch reactor etching the substrate 14 with ions of gas from the plasma 23. The configuration of an etch reactor is illustrated in FIGS. 5 and 6 described below.

Figure 1A:
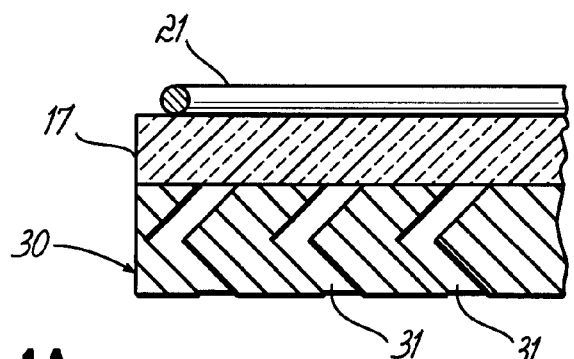
FIGS. 1A–1B are enlarged cross-sectional views through the portion 1A of the window of the reactor of FIG. 1 respectively with and without an insert according to the present invention.

In an iPVD reactor such as reactor 10, material sputtered from the target 24 is ionized by the high density plasma 23 and attracted by bias on the substrate 14 toward the substrate 14 so that the ionized material impinges onto the substrate 14 more perpendicularly than would otherwise occur were the sputtered material not ionized, thereby more effectively entering high aspect ratio features on the substrate 14. In order to prevent material from the chamber 12, such as material which is commonly metal sputtered from the target 24, from depositing onto the window 17, a deposition baffle 30 in the form of a metallic shield is positioned inside of the window 17 spaced approximately 0.8 to 1.0 millimeters from its inside surface, as illustrated in FIG. 1A. The baffle 30 intercepts material from the chamber 12, which is thereby deposited onto the baffle 30 instead of being deposited on the inside surface of the window 17. The baffle 30 has slots 31 therein to prevent electrical currents from being induced in the baffle that would inhibit coupling of energy from the coil 21 into the plasma 23. The baffle is typically metal, but even if it were not, the sputtering of metal from the target 24 would quickly result in deposition of a conductive metal coating on the baffle 30, so that making the baffle out of a similarly conductive material stabilizes the process parameters that would otherwise change if the baffle 30 were to go from non-conductive to conductive with the accumulation of conductive deposits on its surface. The slots 31 are preferably configured to provide no direct line-of-sight paths from the chamber 12 to the window 17. But even with the slots so configured, small amounts of material eventually accumulate on the inside surface of the window 17.

Traces of metal contamination that build up over the long-term operation of the apparatus 10 can be seen on the surface of the dielectric window 17 that is exposed to the interior of the chamber 12. The processes that rely on the ICP require a high RF power level, for example, reaching approximately 5 kW (kilowatts) at 13.56 MHz (megahertz), to achieve optimal process output. When the thickness of metal coating on the inside of the window 17 exceeds about 10 $\mu$m (microns) in thickness, more than 50% of RF power can be diverted from the plasma and instead coupled into the metallic coating on the window. Increased RF power coupling into residual metal deposits on the window, which is typically ceramic, causes localized thermal load on the window 17, which, under certain circumstances, can shorten window life and cause shorter MTBF (mean time between failures) of window 17.

Figure 1B:
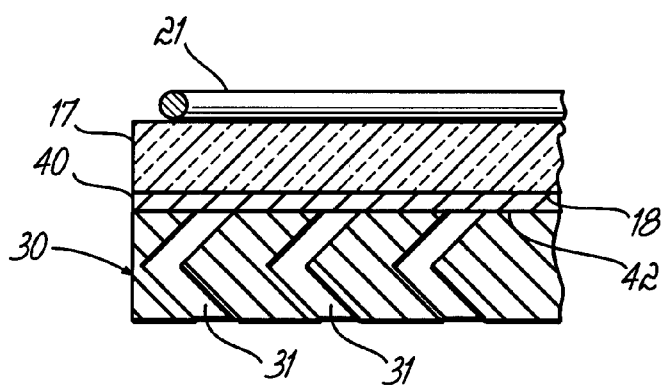

To eliminate contamination of the window and thus its shorter MTBF, a thin protective insert 40 is placed between the deposition shield 30 and window 17, as illustrated in FIG. 1B. With the insert 40, sputtered metal material passing through slots in the shield build up on the surface 42 of the thin protective insert 40, which is now exposed to plasma, instead of on the surface 18 of dielectric window 17. The material of the protective insert 40 is preferably the same as or has coupling properties comparable with the ceramic material of which the dielectric window 17 is made so that it has no effect on the plasma properties inside of the chamber 12. The insert cam be made, for example, of alumina, AlN or silicon. Table 1 compares the properties of materials useable for such an insert.

TABLE 1

Properties of Materials for Protective Insert.

| | $Al_2O_3$ | AlN | Si | SiC | PTFE |
|---|---|---|---|---|---|
| DIELECTRIC CONSTANT | 9.0–10.1 | 8.9 | 11.7 | 6.52 | 2.1–2.8 |
| DIELECTRIC STRENGTH, kV mm$^1$ | 10–35 | 10 | 25–30 | 220–240 | 18.9 |
| VOLUME RESISTIVITY @ 25° C., Wcm | >$10^{14}$ | $10^{11}$–$10^{13}$ | 2.3 × $10^5$ | >$10^5$ (Si) | >$10^{18}$ |
| THERMAL CONDUCTIVITY @ 20° C., Wcm$^{-1}$ K$^{-1}$ | 28–35 | 165 | 131–150 | 230–380 | — |
| THERAML EXPANSIVITY @ 20–1000° C., $10^{-6}$ K$^{-1}$ | 8.0 | 5.3 | 2.6 | 2.9 | 2.5 |
| SOFTENING (OR MELTING) PONT, ° C. | 2050 | — | 1412 | 2830 | 327 |
| UPPER CONTINUOUS USE TEMPERATURE, ° C. | 1800 | 1200 | — | — | 260 |
| CHEMICAL RESISTANCE AGAINST METAL | Good | Good | Good | Good | Good |

The utilization of SiC substrates (grade SI—semi-insulating) may also have advantages for the insert 40. The SiC is an excellent thermal conductor, so heat will flow more readily through SiC than other semiconductor materials. At room temperature, SiC has a higher thermal conductivity than any metal. This property enables SiC devices to be used at extremely high power levels and still dissipate the large amounts of excess heat generated. SiC can withstand a voltage gradient or electric field over eight times greater than can Si without undergoing avalanche breakdown.

Advantages can be realized by using a standard semiconductor substrate as the insert 40. Such substrates are produced in large quantities and can serve as consumable components in the semiconductor processing 10. They are 100% compatible with the process being performed on such semiconductor substrates in the chamber 12, since they are a standard on which process compatibility is based. A very practical protective insert is a silicon wafer having a diameter of 200 mm and a thickness of about 300 $\mu$m. Other ceramic substrates used in the electronics industry having comparable dimensions may be useful. For low RF power applications or where the deposition shield 30 is provided with adequate cooling, a PTFE (TEFLON™) insert may be an appropriate material for the insert 40. Preferably, however, high temperature ceramic materials are more advantageous.

Figure 2A:
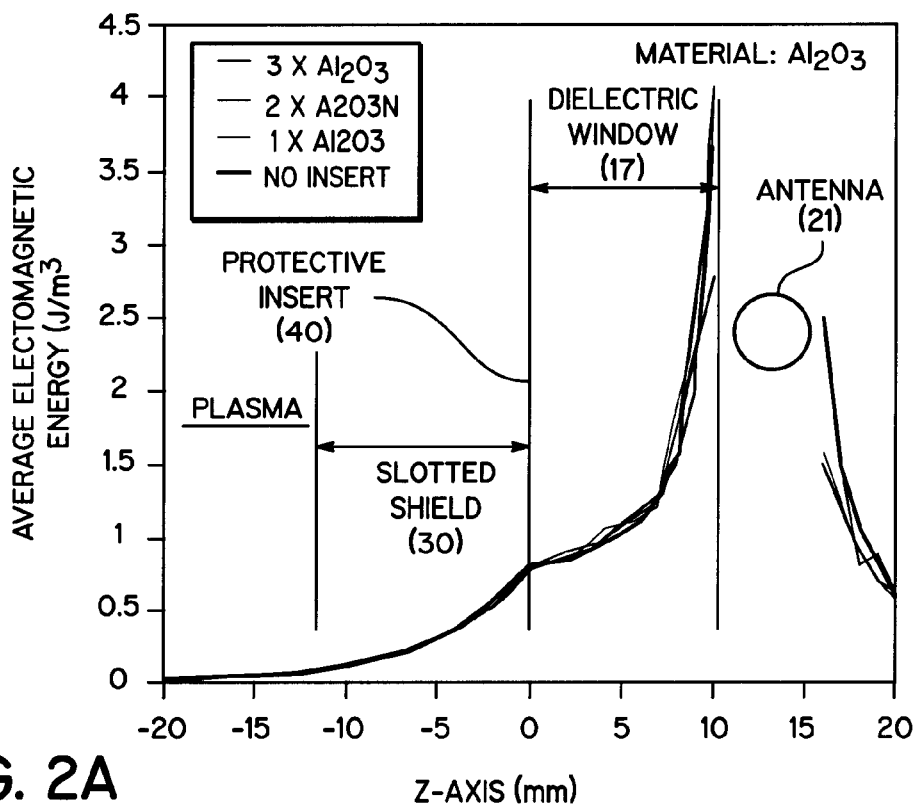
Figure 2B:
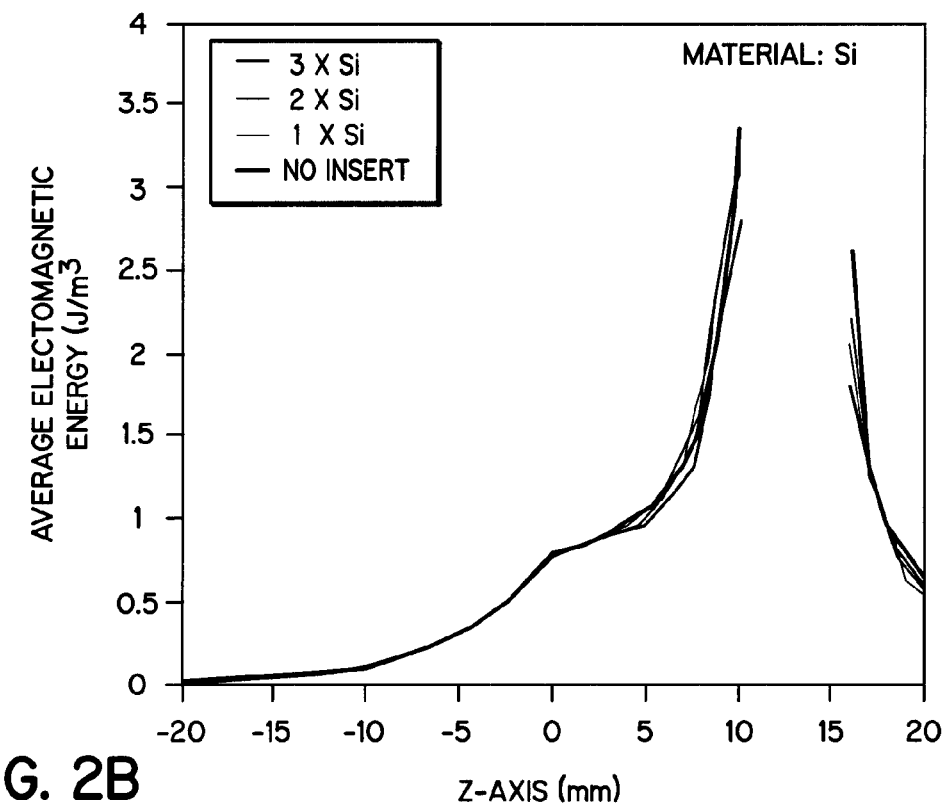
Figure 2C:
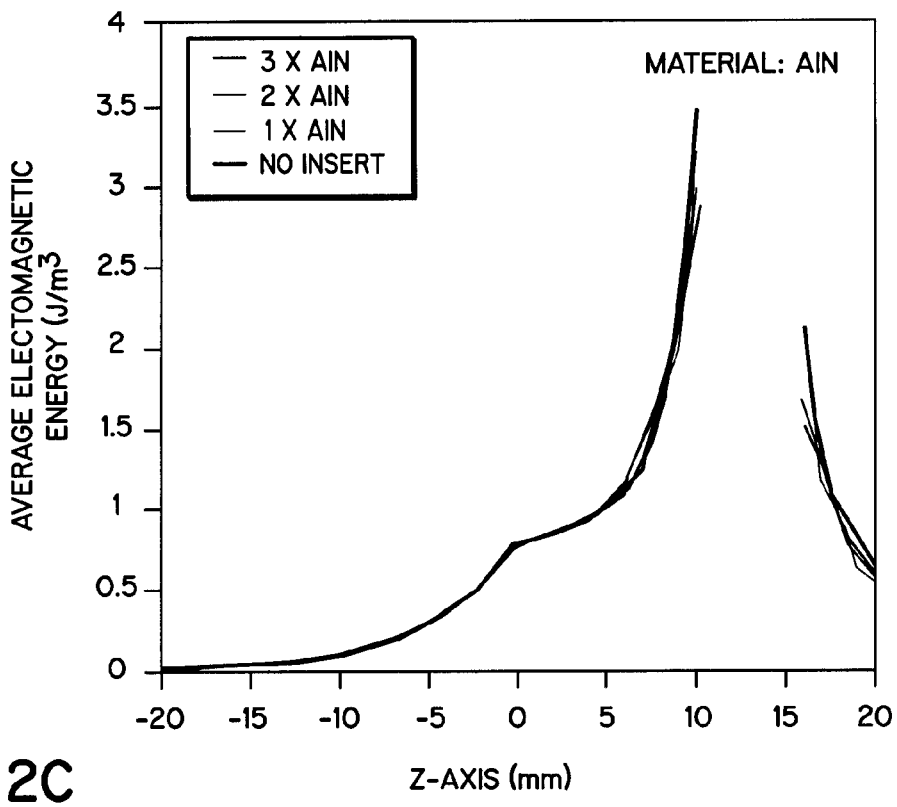
Figure 2D:
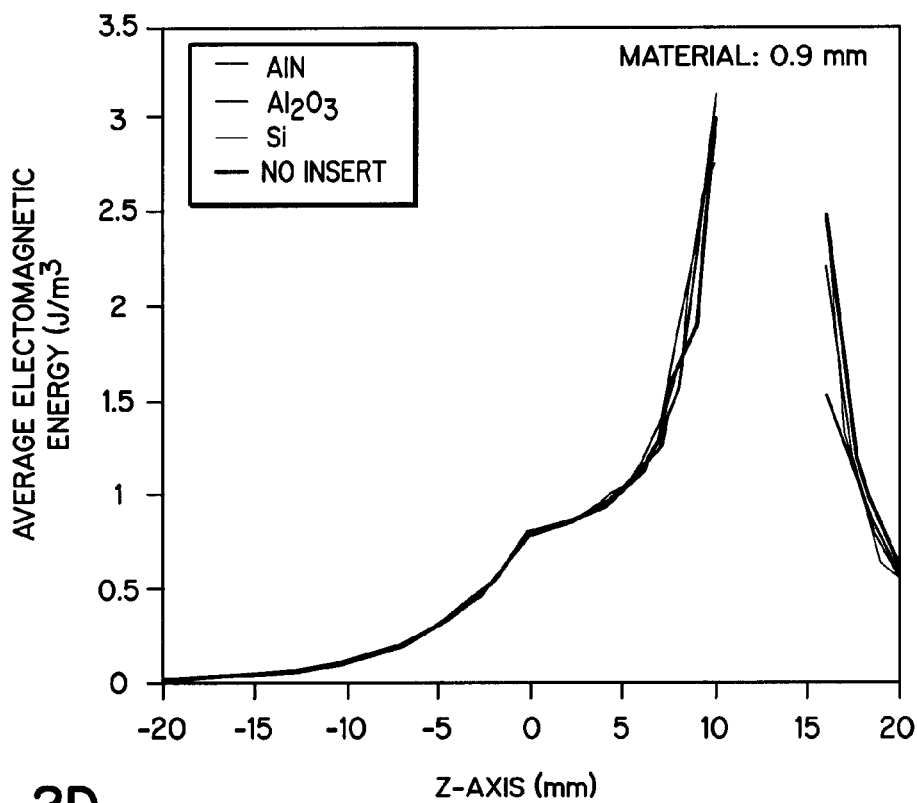

The average electromagnetic energy density of the RF magnetic field after passing the protective insert is shown on graphs of FIGS. 2A–2C for various materials and different thicknesses. The graphs show the average electromagnetic energy density vs. distance from the antenna 21 for protective inserts to be essentially the same for the various materials for the inserts 40 of (a) $Al_2O_3$, (b) AlN and (c) Si, and at the three different total thicknesses of 0.9 mm, 0.6 mm and 0.3 mm, (using 3, 2 and 1 standard 0.3 mm thick wafers respectively) as well as without the insert 40. Graph (d) of FIG. 2D shows a comparison for the materials noted above at a total thickness of 0.9 mm. The graphs represent simulation results obtained by Maxwell EM 3D modeling of antenna made of a tubular conductor of 5 mm in diameter radiating RF power through an alumina window having a total thickness of 9 mm into a conductive plasma. The positions of the antenna 21 and dielectric window 17 are depicted in graph (a) of FIG. 2A. The graphs show that at a thickness of approximately one millimeter, the protective insert 40 produces substantially no reduction in RF power transfer into plasma, and the use of the protective insert 40 does not materially affect other process parameters.

Figure 3:
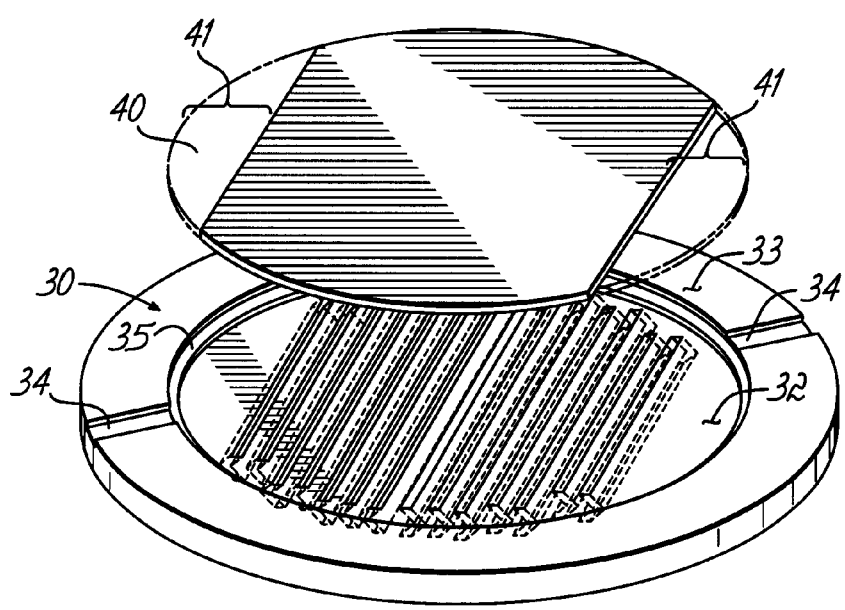
FIG. 3 is a disassembled perspective view of the window assembly the iPVD reactor of FIG. 1 illustrating a standard semiconductor wafer used as the protective insert.
Figure 4:
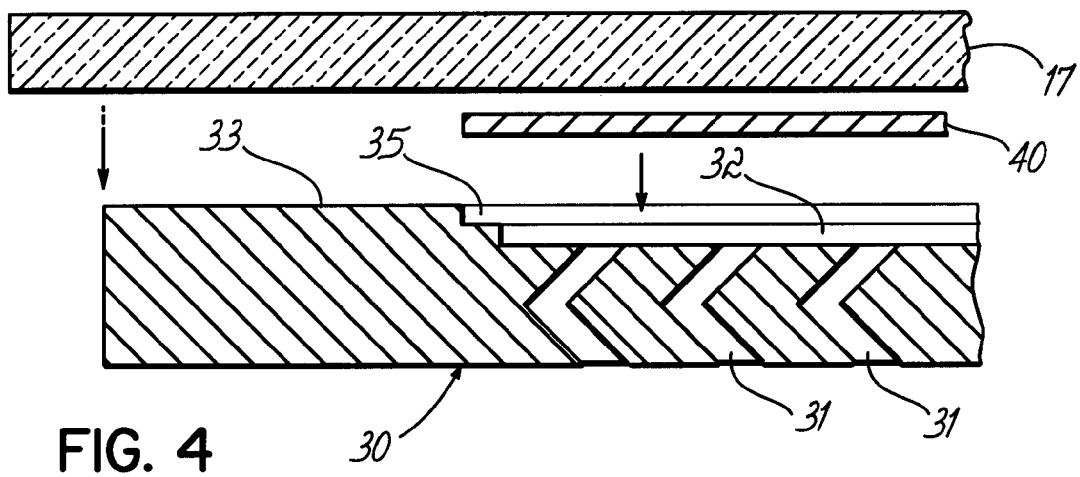
FIG. 4 is a diagrammatic cross-sectional view illustrating one manner of mounting the insert in the embodiment of FIG. 3.

FIG. 3 illustrates a standard silicon semiconductor wafer being used as the protective insert 40 and positioned in relation to the deposition shield 30 as configured for an iPVD reactor. The shield 30 has a circular recess 32 therein defined by the inwardly facing inner edge of an annular rim 33. The insert 40 nests in the recess 32. An annular shoulder or step 35 lies inwardly of the rim 33, which allows the insert 40 to be supported with a space between the insert 40 and the shield 30, as illustrated in FIG. 4. A pair of channels 34 are formed through the rim 33 of the shield 30. The channels 34 communicate with spaces formed by respective cut-off portions 41 of the insert 40. The cut-off portions 41 allow the space between the insert 40 and the dielectric window 17 to be pumped to vacuum to avoid a pressure gradient across the insert 40 that could crack it. In this arrangement, typically the window 17 is sealed around its edges to the rim of an opening in the wall of the chamber. Alternatively, as shown in FIG. 5, a shield in the form of shield 30a may include a rim 33a that is sealed around the opening 16 to the chamber wall 11. The dielectric window 17a may be provided with an O-ring or other seal 37, and sealed to the shield 30a with seal 38 to seal a space between the window 17a and the shield 30a that contains the insert 40.

The protective insert 40 is not attached to or in contact with ceramic window 17,17a thereby avoiding direct thermal contact between the insert 40 and the window 17,17a. The insert 40 is placed in recess on the top side of deposition shield. With this arrangement, even an accidental break of the protective insert 40 will not cause failure of plasma source since the vacuum will not be lost to the atmosphere as in the case of a dielectric window failure. To improve further thermal insulation between the insert 40 and the window 17,17a, a gap is maintained of approximately 1 mm between the protective insert 40 and deposition shield 30, as shown in FIG. 4. The shoulder 35 around the recess 32 provides an additional recess in deposition shield 30 that creates a stepwise surface on deposition shield 30. The shape of protective insert 40 allows for the gas in the space between protective insert 40 and dielectric window 17, 17a to be pumped out of the chamber, for example, through the shallow channels 34 machined in deposition shield 30 and through openings 41 provided by the shape of the protective insert itself (FIG. 3).

The above described structure provides several advantages. First, cost savings are realized because the protective insert reduces the need for the machined ceramic window 17 to be replaced or cleaned due to premature contamination, which, because of sealing surfaces that must be machined on the window 17, is costly. In the case of an AlN window, this represents significant cost savings. In the case of $Al_2O_3$ windows, the cost is about US$300, compared to the cost of about US$20 for a simple silicon wafer (200 mm in diameter).

The invention also provides other material cost savings. For example, the protected window 17 can be re-used, since it is not significantly contaminated by sputtered process products. Furthermore, a window 17 protected by a shield 40 does not need to be aggressively cleaned, so sensitive sealing surfaces will not be damaged, thereby maintaining the original vacuum integrity of the system.

Furthermore, such a protective insert 40 can be replaced more easily than the robust ceramic window 17 can be removed and cleaned. Hence, a blank silicon wafer can be used as an insert 40, thereby providing a consumable insert having a much lower cost than the cost of maintaining an unprotected window.

Test and metrology cost savings also results. A contaminated protective insert 40 can be used as a sample that will be evaluated after replacement, typically after the lifetime of the target in ionized PVD, or during any maintenance services on the source 50 allowing removal of the protective insert 40, so that data can be compared on the thickness and composition of deposited contaminated layer. The standard semiconductor metrology instrumentation can be used for such evaluation since the shape and dimensions of protective insert 40 are consistent with semiconductor substrates. Obtained data on thickness and composition of the layer provides feedback to a manufacturer of semiconductors and of the processing apparatus 10 and may be used for continuous improvements of the plasma source and the processes performed therein. The protective insert 40 can be used also in other plasma processing systems that do not produce conductive coatings. In such case, a replaceable protective insert 40 reduces the time required for cleaning the chamber and the chamber cleaning frequency.

While the above description and accompanying drawings set forth various embodiments of the invention, it will be apparent to those skilled in the art that additions and modifications may be made without departing from the principles of the invention. Accordingly,

What is claimed is:

1. A method of protecting a dielectric window in the wall of a plasma processing chamber from deposits of material from within the processing chamber in which a semiconductor wafer is being processed, the method comprising:

providing a replaceable wafer of the same material as the semiconductor wafer being processed inside of the chamber and replaceably mounted in close proximity to the window so as to protect the window from deposits of material from within the chamber;

a slotted shield is provided inside of the chamber adjacent the window; and the providing of the replaceable wafer includes inserting the replaceable wafer between the window and the shield.

2. The method of claim 1 further comprising: removing and replacing the replaceable wafer with another after processing one or more semiconductor wafers in the chamber.

3. A method of protecting a dielectric window, in the wall of plasma processing chamber through which energy is inductively coupled from an antenna outside of the chamber into a plasma within the chamber, from deposits of material from the processing chamber through slots in a protective shield that is spaced from the window inside of the chamber, the method comprising:

providing a replaceable dielectric or otherwise non-metallic insert between the window and the shield so as to substantially cover therewith the surface of the dielectric window that is susceptible to deposits of material from the processing chamber through slots in the protective shield, and to thereby collect the material passing through the slots in the protective shield and prevent deposits thereof onto the surface of the dielectric window.

4. The method of claim 3 wherein a semiconductor wafer is being processed in the chamber and wherein:

the providing of the replaceable dielectric insert includes providing an insert that is compatible with the processing of the semiconductor wafer being processed inside of the chamber.

5. The method of claim 3 wherein a semiconductor wafer is being processed in the chamber and wherein:

the providing of the replaceable dielectric insert includes providing an insert in the form of a wafer of the same material as the semiconductor wafer being processed inside of the chamber.

6. The method of claim 3 further comprising:

removing the insert after material has deposited thereon and replacing the insert with another insert.

7. The method of claim comprising:

removing the insert and replacing the insert with another insert formed of a material compatible with next process to be performed in the chamber.

\* \* \* \* \*

UNITED STATES PATENT AND TRADEMARK OFFICE
CERTIFICATE OF CORRECTION

PATENT NO. : 6,666,982 B2  Page 1 of 1
DATED : December 23, 2003
INVENTOR(S) : Jozef Brcka It is certified that error appears in the above-identified patent and that said Letters Patent is hereby corrected as shown below:

Title page,
Item [*] Notice, delete the phrase "by 0 days" and insert -- by 54 days --

Signed and Sealed this

Fifth Day of October, 2004

JON W. DUDAS
*Director of the United States Patent and Trademark Office*

UNITED STATES PATENT AND TRADEMARK OFFICE
CERTIFICATE OF CORRECTION

PATENT NO. : 6,666,982 B2
DATED : December 23, 2003
INVENTOR(S) : Jozef Brcka

It is certified that error appears in the above-identified patent and that said Letters Patent is hereby corrected as shown below:

Column 5,
Line 2, reads "...alumina, AIN or silicon. Table 1 compares the properties..." and should read -- ...alumina, AIN or silicon. Table 1 compares the properties … --.
Line 10, Table 1, reads "DIELECTRIC STRENGTH, kV mm$^1$..." and should read -- DIELECTRIC STRENGTH, kV mm$^{-1}$... --.
Line 14, Table 1, reads "SOFTENING (OR MELTING) PONT, ..." and should read -- SOFTENING (OR MELTING) POINT, … --.

Column 6,
Line 11, Table 1, reads "...>10$^5$ (Si)..." and should read -- ...> 10$^5$(SI)… --.

Column 8,
Lines 10-11, read "...window, in the wall of plasma processing chamber through which..." and should read -- ... window, in the wall of a plasma processing chamber through which… --.
Line 41, reads "7. The method of claim comprising:..." and should read -- 7. The method of claim 3$^{[u]}$ further comprising:… --.

Signed and Sealed this

Third Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,666,982 B2
DATED : December 23, 2003
INVENTOR(S) : Jozef Brcka

It is certified that error appears in the above-identified patent and that said Letters Patent is hereby corrected as shown below:

Column 5,
Line 2, reads "...alumina, AlN or silicon. Table 1 compares the properties..." and should read -- ...alumina, AlN or silicon. Table 1 compares the properties ... --.
Line 10, Table 1, reads "DIELECTRIC STRENGTH, kV mm$^1$..." and should read -- DIELECTRIC STRENGTH, kV mm$^{-1}$... --.
Line 14, Table 1, reads "SOFTENING (OR MELTING) PONT, ..." and should read -- SOFTENING (OR MELTING) POINT, ... --.

Column 6,
Line 11, Table 1, reads "...>10$^5$ (Si)..." and should read -- ...> 10$^5$(SI)... --.

Column 8,
Lines 10-11, read "...window, in the wall of plasma processing chamber through which..." and should read -- ... window, in the wall of a plasma processing chamber through which... --.
Line 41, reads "7. The method of claim comprising:..." and should read -- 7. The method of claim 3$^{[u]}$ further comprising:... --.

This certificate supersedes Certificate of Correction issued May 3, 2005.

Signed and Sealed this

Twenty-sixth Day of July, 2005

JON W. DUDAS
*Director of the United States Patent and Trademark Office*